Feb. 16, 1971 O. VALCIK 3,564,357

MULTILAYER SEMICONDUCTOR DEVICE WITH REDUCED SURFACE CURRENT

Filed March 26, 1969

INVENTOR
O. Valčík
BY
Richard Low agt

United States Patent Office 3,564,357
Patented Feb. 16, 1971

3,564,357
MULTILAYER SEMICONDUCTOR DEVICE WITH REDUCED SURFACE CURRENT
Oto Valcik, Prague, Czechoslovakia, assignor to CKD Praha oborovy podnik, Prague, Czechoslovakia
Filed Mar. 26, 1969, Ser. No. 810,763
Int. Cl. H01l 5/02
U.S. Cl. 317—235 8 Claims

ABSTRACT OF THE DISCLOSURE

In a monocrystalline semiconductor body a layer of one conductivity type is sandwiched between a pair of adjacent layers of opposite conductivity type. A fourth layer of the one conductivity type having a smaller diameter than any of the other layers is formed in one of the adjacent layers and determines the functional cross section of the device, each of the other layers extending beyond the functional cross section in a peripheral border area.

DESCRIPTION OF THE INVENTION

Figure 1:
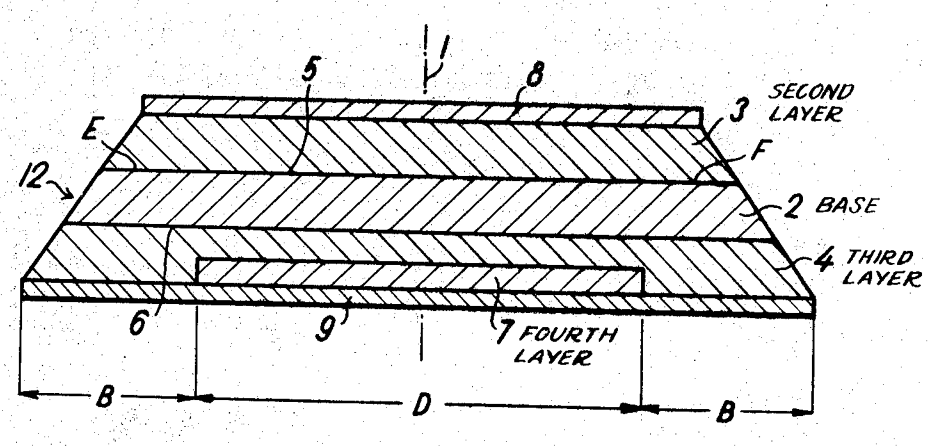

The present invention relates to a multilayer semiconductor device. More particularly, it relates to a multilayer semiconductor device with reduced surface current.

In known methods, multilayer semiconductor devices are produced by alloying, diffusion, epitaxial growth or combinations of these. Planar-parallel layers having various thicknesses and desired distributions of significant impurities and conductivity types are formed on or in the semiconductor body. In order to obtain good voltage characteristics, it is necessary that the different conductivity type layers be alternately disposed on the surface of the semiconductor body as well as within said semiconductor body. It is extremely difficult to prepare the surface of the semiconductor body so as to obtain a distribution of the electric field with negligible surface conductivity. The requirements for reducing the surface current, and primarily its peripheral distribution, increase with the operating voltage and with the number of layers of the semiconductor device because the surface current can produce undesired operation of the device. Thus, the surface current may cause a thyristor to fire at an operating voltage lower than the breakdown voltage when no control or firing signal is supplied to the thyristor.

The principal object of the present invention is to provide a new and improved multilayer semiconductor device.

One object of the invention is to provide a multilayer semiconductor device with reduced surface current.

Another object of the invention is to provide a multilayer semiconductor device with reduced surface current in the emitter layer.

Still another object of my present invention is to provide a multilayer semiconductor device which functions with efficiency, effectiveness, and reliability.

A further object of this invention is to provide a multilayer semiconductor device which is devoid of adverse effects of the exposed surface of the semiconductor body.

In accordance with the present invention, a multilayer semiconductor device comprises a monocrystalline semiconductor body having an axis and a plurality of adjacent coaxial layers of alternate conductivity type. One of the layers is of one conductivity type and the adjacent layer on each side of the one of the layers is of opposite conductivity type and forms with the one of the layers a pn junction. A fourth of the layers is of the one conductivity type and has a smaller diameter than any of the other layers. The fourth of the layers is formed in one of the layers adjacent the one of the layers and determines the functional cross section of the device. Each of the layers other than the fourth of the layers extends beyond the functional cross section of the device in a peripheral border area. Each of a pair of electrodes is in electrical contact with a corresponding one of the layers adjacent the one of the layers. The electrode contacting the layer in which the fourth of the layers is formed also electrically contacts the fourth of the layers, thereby short-circuiting the fourth of the layers and the layer in which it is formed. The one of the layers functions as the base electrode.

The semiconductor device of the present invention does not practically conduct any current for either polarity of applied voltage until the breakdown voltage is reached. The outer characteristics of the device are thus not influenced as long as its operating voltage is not higher.

In order to avoid the influence of the surface current on the operation of the inner multilayer structure of the device the device has to be sufficiently wide. Thus, the difference between the diameter of the one of the layers and the diameter of the fourth of the layers is from two to ten thousand times greater than the thickness of the one of the layers.

For further improvement of the effects, the gradient of impurity concentration at the pn junctions between the one of the layers and the layers adjacent to the one of the layers in the peripheral border area of the device has a maximum equal to the gradient of impurity concentration of the pn junctions at any point in the functional cross section of the device. Furthermore, the gradient of impurity concentration at the pn junctions between the one of the layers and the layers adjacent to the one of the layers increases from the peripheral border area at a distance from the peripheral surface of the device equal to at least five times the thickness of the one of the layers toward the axis of the semiconductor body in the functional cross section of the device.

This insures that the operating voltage of the device is limited by an avalanche breakdown of the functional cross section part of the device. The device then absorbs excess voltages applied to it, without undesirable effects.

One of the electrodes is divided into two separate electrodes each in electrical contact with the same layer, or one of the electrodes may have an aperture formed therethrough and a third electrode separate from the one of the electrodes may be positioned in the aperture and in electrical contact with the layer electrically contacted by the one of the electrodes.

Figure 2:
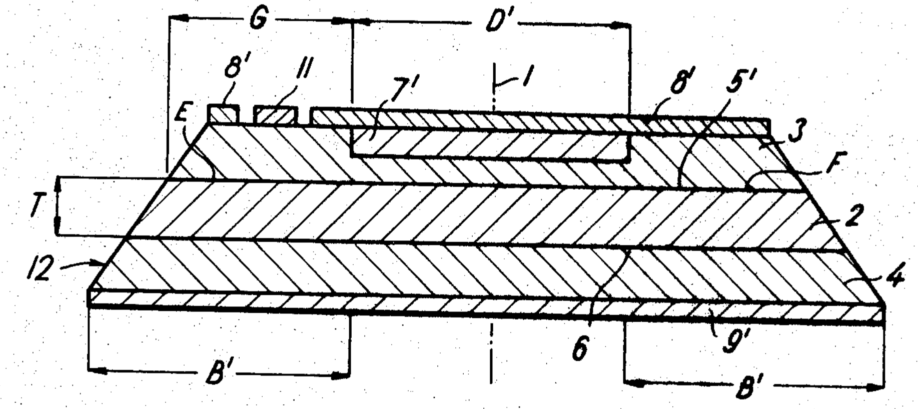

In order that the present invention may be readily carried into effect it will now be described with reference to the accompanying drawing wherein:

FIG. 1 is a sectional view of an embodiment of the semiconductor device of the present invention; and FIG. 2 is a sectional view of another embodiment of the semiconductor device of the invention.

In each of FIGS. 1 and 2, a monocrystalline semiconductor body of any suitable material such as, for example, silicon has a central axis 1 and a plurality of adjacent circular coaxial layers 2, 3 and 4 of alternate conductivity type. Thus, the base layer 2 may be doped with aluminum and may be of p conductivity type and each of the adjacent second layer 3 and the adjacent third layer 4 may be doped with phosphorus and may be of n conductivity type.

The base layer 2 may be of n conductivity type and each of the second and third layers 3 and 4 may be of p conductivity type. The first and second layers 2 and 3, respectively, form a pn junction 5 with each other, and the first and third layers 2 and 4, respectively, form a pn junction 6 with each other.

A fourth layer 7, of the same conductivity type as the first layer 2, has a diameter D which is smaller than that of any of the other layers 2, 3 and 4. In the embodiment of FIG. 1, the fourth layer 7 is formed in the third layer 4 and determines the functional cross section of the device, as indicated by the diameter D. In the embodiment of FIG. 2, the fourth layer 7' is formed in the second layer 3 and determines the functional cross section of the device, as indicated by the diameter D'.

Each of the layers 2, 3 and 4, other than the fourth layer 7, extends beyond the functional cross section of the device in a peripheral border area B of substantially annular configuration in FIG. 1. Each of the layers 2, 3 and 4, other than the fourth layer 7' extends beyond the functional cross section of the device in a peripheral border area B' of substantially annular configuration in FIG. 2. The outer or peripheral border area B or B' has only three layers 2, 3 and 4 and the inner or functional cross section area D has four layers 2, 3, 4 and 7 or 7'.

An electrode 8 is in electrical contact with the second layer 3 in the embodiment of FIG. 1. In FIG. 1, an electrode 9 is in electrical contact with the third layer 4 in which the fourth layer 7 is formed. The electrode 9 is also in electrical contact with the fourth layer 7, thereby short-circuiting said fourth layer and the third layer 4.

An electrode 8' is in electrical contact with the second layer 3, in which the fourth layer 7' is formed, in FIG. 2. The electrode 8' is divided into two separate electrodes 8' and 11. The electrode 8' is in electrical contact with the fourth layer 7', thereby short-circuiting said fourth layer and the second layer 3. The electrode 8' has an aperture formed therethrough or a recess or indentation formed therein and electrode 11 is positioned in the aperture or recess and is in electrical contact with the second layer 3 in the outer area B.

An electrode 9' is in electrical contact with the third layer 4 in the ambodiment of FIG. 2. Each of the electrodes 8, 9, 8', 9' and 11 may comprise any suitable material such as, for example, nickel or palladium.

The surface current influencing the electric field in proximity with the surface 12 in FIGS. 1 and 2, enters and leaves the surface area directly across the electrodes 8 or 8' and 9 or 9' in the outer or peripheral border area B. Consequently, the electric field in the inner or functional cross section area D is not influenced.

If the gradient of impurity concentration E at the pn junction in the peripheral border area B is smaller than or equal to the gradient of impurity concentration F in the functional cross section area D, the outer characteristics of the device are not influenced at all. If the gradient of impurity concentration in the peripheral border area B is greater than that in the functional cross section area D, however, the outer characteristics of the device in the breakdown voltage area are determined by said gradient in the peripheral border area B, and if there is a sufficient difference between these gradients, it is impossible to attain an adequate breakdown voltage.

The gradient of impurity concentration at the pn junctions between the first and second and second and third layers 2 and 3 and 3 and 4, respectively, in the peripheral border area B has a maximum equal to the gradient of impurity concentration of the pn junctions at any point in the functional cross section D of the device. That is, the gradient of impurity concentration in the peripheral border area B is equal to or less than that in the functional cross section D. The gradient of impurity concentration increases from the peripheral border area B at a distance from the peripheral surface 12 of the device equal to at least five times the thickness T (FIG. 2) of the first layer 2 toward the axis 1 of the semiconductor body in the functional cross section D of the device.

The gradient of impurity concentration at the pn junctions 5 and 6 in the peripheral border area B may be, for example, $10^{17}$ to $10^{18}$ cm.$^{-4}$ and the gradient of impurity concentration at the pn junctions 5 and 6 in the functional cross section D may be, for example, $10^{19}$ to $10^{20}$ cm.$^{-4}$.

The fourth layer 7 (FIG. 1) and the fourth layer 7' (FIG. 2) are identical in function, which is the emission of electrons or holes. They may be of different conductivity type, as produced by diffusion. The first layer 2 is the base electrode. The device of FIG. 2 is a thyristor and its electrode 11 functions as a gate or control electrode.

The difference G (FIG. 2) between the diameter of the first layer 2, or more particularly, the smallest diameter, closest to the emitter, of said first layer, and the diameter of the fourth layer 7 or 7' is from two to ten thousand times greater than the thickness T of said first layer.

While the invention has been described by means of specific examples and in specific embodiments, we do not wish to be limited thereto, for obvious modifications will occur to those skilled in the art without departing from the spirit and scope of the invention.

I claim:

1. A semi-conductor device formed of a plurality of circular monocrystalline layers of alternate conductive types having a central axis, comprising at least a first layer of one conductivity and second and third layers of opposite conductivity, said second and third layers being located coaxially adjacent to and on opposite sides of said first layer to form therewith a pair pn junctions, a fourth layer having a diameter substantially smaller than any of the first, second and third layers and of the same conductivity as said first layer, said fourth layer being located within one of said second and third layers and arranged about the central axis to provide the semi-conductor device with a functional cross section therealong determined by the diameter of said fourth layer and a peripheral annular border concentric thereabout, the gradient of impurity concentration at the pn junction between said first layer and the layers adjacent to said first layer in the peripheral border being less than the gradient of impurity concentration at any point between said first layer and the layers adjacent to said first layer in the area of the functional cross section of the device, a pair of electrodes coextensive and coaxial with the layers they contact, one of said electrodes being in simultaneous contact with and continuously short circuiting said fourth layer and the second and third layers in which it is located about its entire periphery and the other of said electrodes being in electrical contact with the other of said second and third layers.

2. A multilayer semiconductor device as claimed in claim 1, wherein the difference between the diameter of said one of said layers and the diameter of said fourth of said layers is from two to ten thousand times greater than the thickness of said one of said layers.

3. A multilayer semiconductor device as claimed in claim 1, wherein said first electrodes has an aperture formed therethrough and a third electrode separate from said first electrode is positioned in said aperture in electrical contact with the second and third layers electrically contacted by said first electrode.

4. A multilayer semiconductor device as claimed in claim 1, wherein said first electrode is divided into two separate electrodes each in electrical contact with the same layer.

5. A semi-conducted device formed of a plurality of circular monocrystalline layers of alternate conductive types having a central axis, comprising at least a first layer of one conductivity and second and third layers of opposite conductivity, said second and third layers being located coaxially adjacent to and on opposite sides of said first layer to form therewith a pair pn junctions, a fourth layer having a diameter substantially smaller than any of the first, second and third layers and of the same conductivity as said first layer, said fourth layer being located within one of said second and third layers and coaxially arranged about the central axis to provide the semi-conductor device with a functional cross section therealong determined by the diameter of said fourth layer and a peripheral annular border concentric thereabout, the gradient of impurity concentration at the pn junctions between said first layer and the layers adjacent thereto increases from the peripheral border area at a distance from the peripheral surface of said device equal to at least five times the thickness of said first layer toward the central axis in functional cross section of said device, a pair of coaxial electrodes, one of said electrodes being in simultaneous contact with the entire periphery and continuously short circuiting said fourth layer and the second and third layers in which it is located and the other of said electrodes being in electrical contact with the other of said second and third layers.

6. A multilayer semi-conductor device as claimed in claim 5, wherein the difference between the diameter of said one of said layers and the diameter of said fourth of said layers is from two to ten thousand times greater than the thickness of said one of said layers.

7. A multilayer semi-conductor device as claimed in claim 5, wherein said first electrode has an aperture formed therethrough and a third electrode separate from said first electrode is positioned in said aperture in electrical contact with the second and third layers electrically contacted by said first electrode.

8. A multilayer semi-conductor device as claimed in claim 5, wherein said first electrode is divided into two separate electrodes each in electrical contact with the same layer.

References Cited

UNITED STATES PATENTS

| | | | |
|---|---|---|---|
| 3,124,703 | 3/1964 | Sylvan | 307—88.5 |
| 3,337,782 | 2/1967 | Todaro | 317—235 |
| 3,397,326 | 8/1968 | Gallagher et al. | 307—304 |
| 3,422,323 | 1/1969 | Whoriskey | 317—235 |
| 3,437,889 | 7/1969 | Eugster | 317—235 |
| 3,372,318 | 3/1968 | Tefft | 317—235 |
| 3,236,698 | 2/1966 | Shockley | 317—235X |
| 3,428,870 | 2/1969 | Davis | 317—234 |

JAMES D. KALLAM, Primary Examiner

U.S. Cl. X.R.

317—234